United States Patent
Wang

(10) Patent No.: US 6,197,684 B1
(45) Date of Patent: Mar. 6, 2001

(54) METHOD FOR FORMING METAL/METAL NITRIDE LAYER

(75) Inventor: Chein-Cheng Wang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/272,899

(22) Filed: Mar. 19, 1999

(51) Int. Cl.$^7$ ........................................... H01L 21/44
(52) U.S. Cl. .................... 438/643; 438/653; 438/906; 438/679; 438/630
(58) Field of Search ........................ 438/643, 653, 438/668, 679, 685, 906, 649, 630, 659; 257/763, 741, 748, 750, 751, 758

(56) References Cited

U.S. PATENT DOCUMENTS

| | | | |
|---|---|---|---|
| 5,401,675 | * 3/1995 | Lee et al. ........................ | 438/653 |
| 5,547,881 | * 8/1996 | Wang et al. ..................... | 438/384 |
| 5,600,182 | * 2/1997 | Schinella et al. ................ | 257/763 |
| 5,804,505 | * 9/1998 | Yamada et al. .................. | 438/643 |
| 5,885,896 | * 3/1999 | Thakur et al. ................... | 438/649 |

* cited by examiner

*Primary Examiner*—Matthew Smith
*Assistant Examiner*—Igwe U. Anya
(74) *Attorney, Agent, or Firm*—Oppenheimer Wolf & Donnelly, LLP

(57) ABSTRACT

A method for forming a metal/metal nitride layer. A dielectric layer is formed on a substrate comprising a conductive region. The dielectric layer comprises an opening exposing a portion of the conductive region. A conformal metal layer is formed on the dielectric layer by physical vapor deposition using a collimator to cover the exposed conductive region. A metal nitride layer is formed on the metal layer. A part of the metal layer may be exposed due to poor step coverage. An implanting process is performed on the metal nitride layer and on the exposed metal layer using a nitric gas.

14 Claims, 3 Drawing Sheets

METHOD FOR FORMING METAL/METAL NITRIDE LAYER

BACKGROUND OF THE INVENTION

1. Field of the Invention

The invention relates in general to the fabrication of semiconductor integrated circuits (ICs), and more particularly to a method for forming a metal/metal nitride layer.

2. Description of the Related Art

As the integration of integrated circuits increases, the surface area of a wafer becomes insufficient for fabrication of required interconnections. In order to meet the surface requirement of the interconnections, multi-layered interconnections have become widely used in highly integrated devices. Typically, a dielectric layer is formed between metallic layers to isolate the metallic layers from each other. A metallic plug is formed to connect the metallic layers to each other. However, in order to improve the adhesion between the metallic plug and other materials as well as to avoid a spike effect between the metallic plug and silicon material, it is necessary to form a barrier layer before the metallic plug.

Titanium nitride (TixNy) is a barrier layer material or a glue layer material frequently used in Very Large Scale Integration (VLSI). In order to improve the ohmic contact between the metallic plug and the silicon material, titanium nitride is usually used with titanium. For example, titanium/titanium nitride (Ti/TiN) are used together as a barrier layer in order to reduce the work function at a junction as well as to prevent the occurrence of the spike effect and electrical migration.

Among all metal materials, tungsten has an advantageous high melting point, heat expansion ratio, and correspondence to silicon. In addition, tungsten deposited by chemical vapor deposition (CVD) does not have a high internal stress, and has a better step coverage. Thus, the manufacture of the metal plug with tungsten deposited by CVD has been widely used in the secondary micrometer process.

FIGS. 1A to 1C are schematic, cross-sectional views showing a conventional method of forming a titanium/titanium nitride layer. In FIG. 1A, a metal oxide semiconductor (MOS) transistor 102 is formed on a substrate 100. A patterned dielectric layer 104 is formed on the substrate 100 to cover the MOS transistor 102. The patterned dielectric layer 104 comprises a contact opening 106 therein. The contact opening 106 exposes a portion of a source/drain region 108 in the substrate 100.

In FIG. 1B, a titanium layer 110 is sputter-deposited on the dielectric layer 104 to cover the exposed source/drain region 108. The titanium layer 110 is conformal to the contact opening 106. In order to increase the deposition ability of the titanium layer 110, a collimator (not shown) is placed between the substrate 100 and a metallic target (not shown) while forming the titanium layer 110.

In FIG. 1C, a titanium nitride layer 112 is formed on the titanium layer 110 by physical vapor deposition (PVD). The titanium nitride layer 112 is conformal to the contact opening 106. The titanium layer 110 and the titanium nitride layer 112 together form a barrier layer. However, the barrier layer formed by physical vapor deposition on a contact or a via, having a high aspect ratio does not have a sufficient step coverage ability. The titanium layer 110 positioned on the corners of the bottom of the contact opening 106 is exposed, as indicated by reference number 114 shown in FIG. 1C, while depositing the titanium nitride layer 112.

When tungsten metal is deposited in the contact opening 106 as a plug, $WF_6$ serves as the gas source for CVD. Once the titanium layer 110 is exposed due to the poor step coverage of the titanium nitride layer 12 or any defect in the titanium nitride layer 112, F atoms released by $WF_6$ can pass through the titanium nitride layer 112 and react with titanium located below to form $TiF_4$. As $TiF_4$ is a volatile gas, a phenomenon similar to an explosion will occur when tungsten is deposited on the contact opening 106. This is known as a volcano effect. The occurrence of such an effect results in removal or bending of the titanium nitride layer 112, allowing tungsten to be deposited on both sides of the titanium nitride 112 layer that are removed. If this occurs on the top end corner of the contact opening or the interlayer opening, there will be a projection of the surface of the tungsten layer. When the projection is too severe, the projection is difficult to remove using a normal reactive etching process. As a result, this leads to the problems of a blind window, a short circuit, wafer pollution, and low production.

SUMMARY OF THE INVENTION

The invention provides a method for forming a metal/metal nitride layer. A dielectric layer is formed on a substrate comprising a conductive region. The dielectric layer comprises an opening exposing a portion of the conductive region. A conformal metal layer is formed on the dielectric layer by physical vapor deposition using collimator to cover the exposed conductive region. A metal nitride layer is formed on the metal layer. A part of the metal layer may be exposed due to poor step coverage. An implanting process is performed on the metal nitride layer and on the exposed metal layer using a nitric gas.

The invention performs the implanting process to reinforce the metal nitride layer. The exposed metal layer can react with the nitric gas to form metal nitride to cover the exposed metal layer. Tungsten can be deposited in the opening without a volcano effect.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
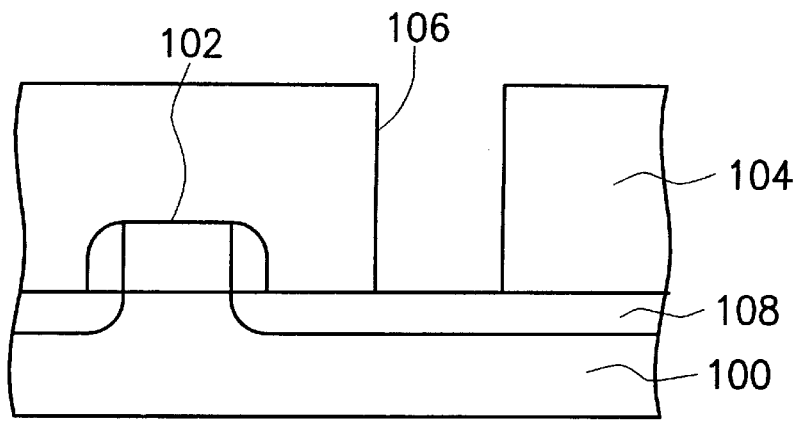
FIGS. 1A to 1C schematic, cross-sectional views showing a conventional method of forming a titanium/titanium nitride layer.
Figure 1B:
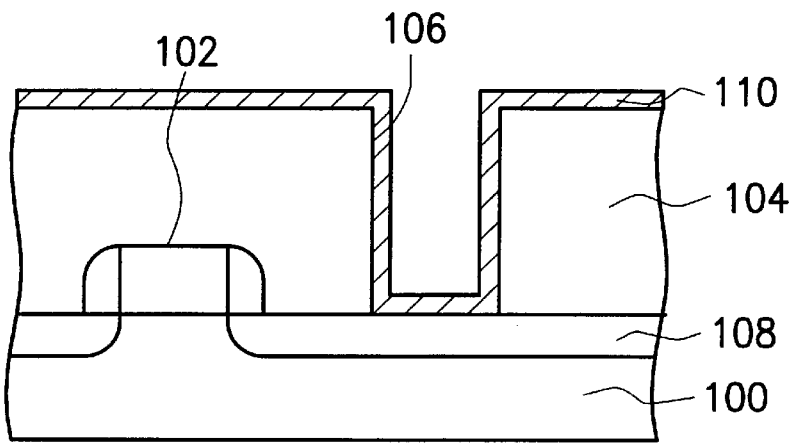
Figure 1C:
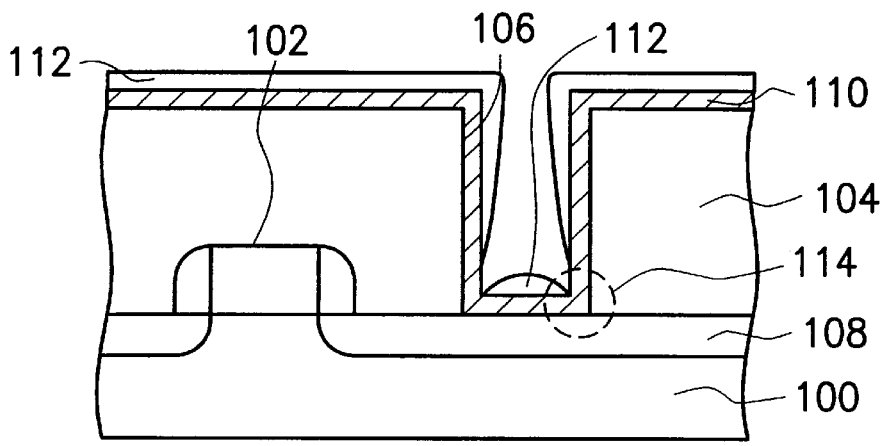

Reference will now be made in detail to the present preferred embodiments of the invention, examples of which are illustrated in the accompanying drawings. In the preferred embodiment of the invention, a metal/metal nitride layer as a barrier layer is formed in a contact opening. Wherever possible, the method of the invention also can be used to form a glue layer in a via. The same reference numbers are used in the drawings and the description to refer to the same or like parts.

Figure 2A:
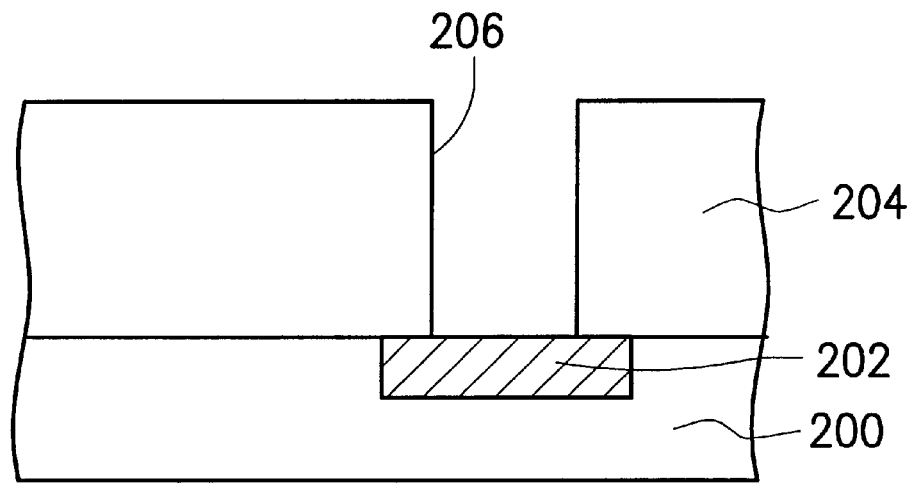
FIGS. 2A to 2D are matic, cross-sectional views showing the process steps of one preferred embodiment of the method according to the invention for forming a metal/metal nitride layer.

FIGS. 2A to 2D are schematic, cross-sectional views showing the process steps of one preferred embodiment of the method according to the invention for forming a metal/metal nitride layer. In FIG. 2A, a substrate 200 comprising a conductive region 202 is provided. The substrate 200 comprises different kinds of structures, such as a transistor, a diode, conventional semiconductor devices, or another metal layer. The conductive region 202 comprises different kinds of structures, such as the gate of a MOS transistor, the source/drain region of the MOS transistor, an interconnect or a plug. The conductive region 202 can be formed from a different kind of material, including aluminum, an aluminum and silicon alloy, an aluminum and copper alloy, copper, an alloy comprising copper and other multi-layer structures. The other multi-layer structures comprise cheap or expensive metal, which has a high melting point.

Figure 2B:
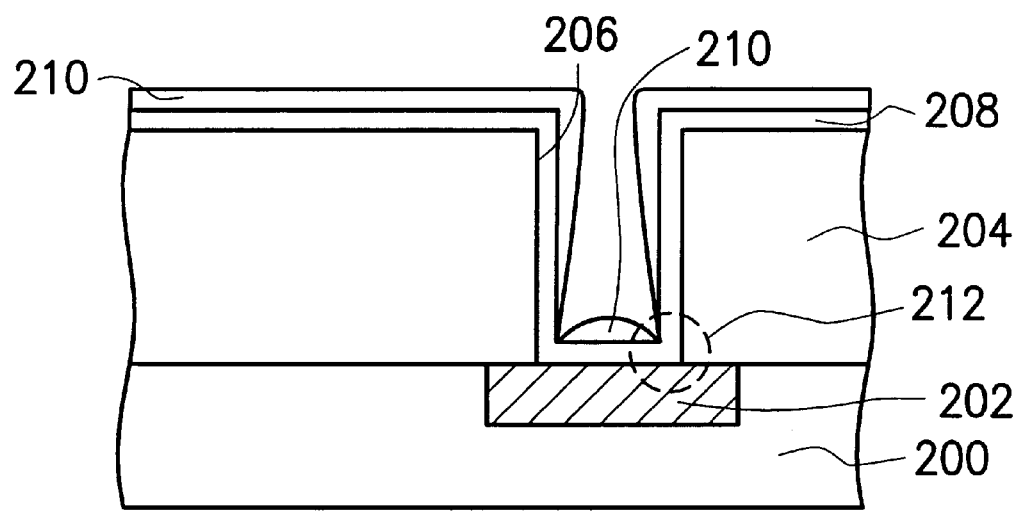

A dielectric layer 204 used as an inter-metal dielectric layer or an inter-layer dielectric layer is formed on the substrate 200. The dielectric layer 204 at least comprises a contact opening 206 to expose the conductive region 202 of the substrate 200. A preferred materials of the dielectric layer is silicon oxide, phosphosilicate glass (PSG) or borophosphosilicate glass (BPSG) deposited by CVD or spin-on-glass (SOG) formed by coating. Depending on the practical needs, the dielectric layer can be planarized by, for example, chemical mechanical polishing (CMP). The dielectric layer 104 has a more planarized surface, so that the subsequent process can be performed more successfully In FIG. 2B, a conformal metal layer 208 is formed on the dielectric layer 204. A material of the metal layer 208 comprises titanium. The preferred method of forming the metal layer 208 is sputtering using a collimator. A metal nitride layer 210 is formed on the metal layer 208. A material of the metal nitride layer 210 comprises titanium nitride. The preferred method of forming the metal nitride layer 210 is the as same as the method of forming the metal layer 208. Since sputtering has poor step coverage, the metal layer 212 may be exposed as shown in FIG. 2B at the bottom corners of the contact opening 206.

Figure 2C:
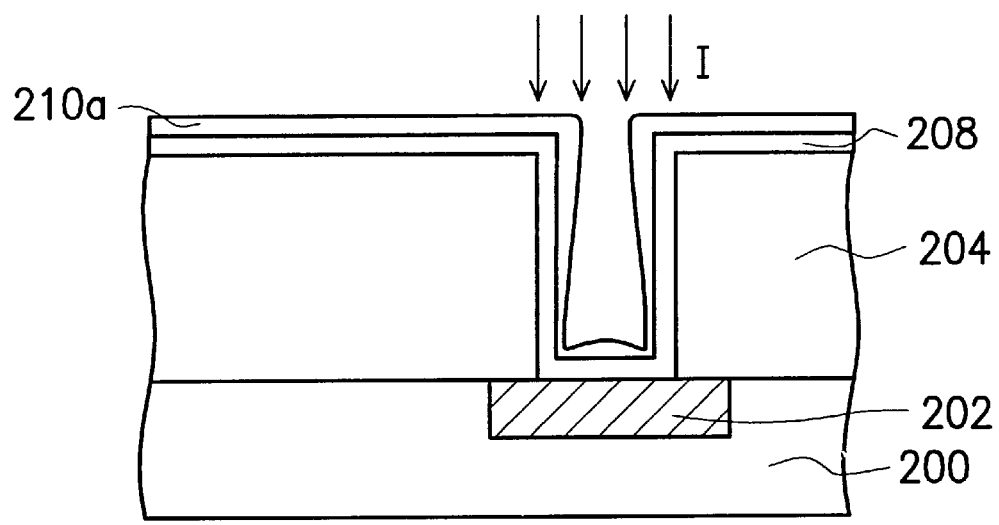

In FIG. 2C, a implanting process I is performed using a nitric gas as a gas source, such as nitrogen ($N_2$) or ammonia ($NH_3$), at about 200–400 degrees Celsius and preferably at 200 degrees Celsius. The implanting process I makes the exposed metal layer 212 react with the nitric gas to form metal nitride 210a. The energy used in the implanting process I is about 10–20 Kev. The implanting dosage is about $1 \times 10^5 – 3 \times 10^5$ atoms/cm$^2$.

Figure 2D:
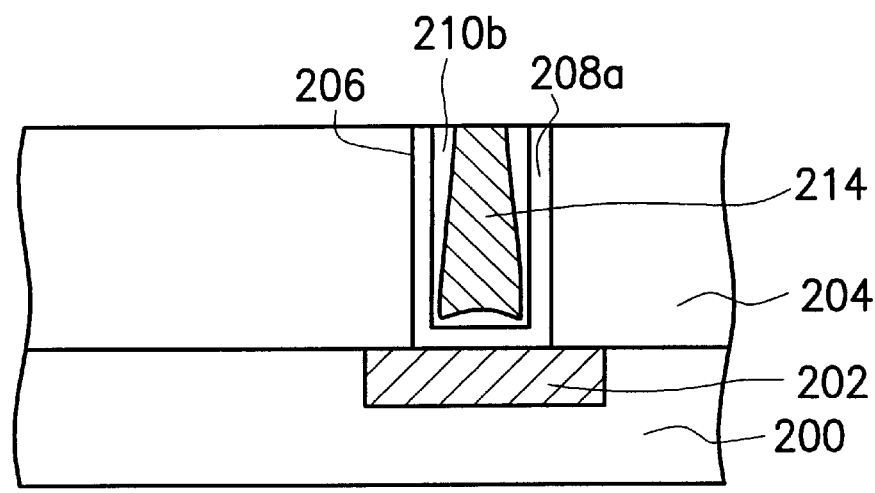

In FIG. 2D, a metal plug 214, such as tungsten, is formed in the contact opening 206, for example, using hydrogen ($H_2$) and tungsten fluoride ($WF_6$) as gas sources. The metal nitride forming in the implanting process I can block F atoms released by $WF_6$ while forming tungsten to fill the contact opening 206. Forming the metal plug 214 comprises the steps of forming a metal material on the metal nitride layer 210a and removing a part of the metal material, a part of the metal nitride layer 210a and a part of the metal layer 208.

The invention performs the implanting process to reinforce the metal nitride layer. The exposed metal layer can react with the nitric gas to form metal nitride to cover the exposed metal layer. While forming the metal plug in the contact opening, the metal nitride forming in the implanting process can block F atoms released by $WF_6$ so that the volcano effect can be prevented.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a metal/metal nitride layer, comprising the steps of:

providing a metal layer on the dielectric layer;

forming a metal layer on the dielectric layer;

forming a metal nitride layer on the metal layer, while a portion of the metal layer is still exposed by the metal layer; and performing an implanting process using a nitric gas as a gas source to convert the exposed metal layer into metal nitride layer directly.

2. The method according to claim 1, wherein the dielectric layer at least comprises a contact opening therein.

3. The method according to claim 1, wherein a material of the metal layer comprises titanium which is formed by sputtering using a collimator.

4. The method according to claim 1, wherein a material of the metal nitride layer comprises titanium nitride which is formed by sputtering using a collimator.

5. The method according to claim 1, wherein the nitric gas is selected from a group comprising nitrogen and ammonia.

6. The method according to claim 1, wherein the implanting process is performed with an energy of about 10–20 Kev, with an implanted dosage of about $1 \times 10^5 – 3 \times 10^5$, at a temperature of about 200–400 degrees Celsius and with a pressure of about $1 \times 10^{-6}$ torr.

7. A method for forming a titanium/titanium nitride layer, comprising the steps of:

providing a substrate at least comprising a conductive region thereon;

forming a dielectric layer on the substrate, wherein the dielectric layer contains a contact opening exposing a part of the conductive region;

forming a conformal titanium layer on the dielectric layer;

forming a titanium nitride layer on the titanium layer;

performing an implanting process to convert any exposed portion of the titanium layer into a titanium nitride layer directly; and forming a metal plug in the contact opening.

8. The method according to claim 7, wherein the titanium layer is formed using a collimator.

9. The method according to claim 7, wherein the titanium nitride layer is formed using a collimator.

10. The method according to claim 7, wherein the implanting process is performed using a nitric gas.

11. The method according to claim 10, wherein the gas is selected from a group comprising nitrogen and ammonia.

12. The method according to claim 7, wherein the implanting process is performed with an energy of about 10–20 Kev, with an implanted dosage of about $1 \times 10^5 – 3 \times 10^5$, at a temperature of about 200–400 degrees Celsius and with a pressure of about $1 \times 10^{-6}$ torr.

13. The method according to claim 7, wherein a material of the metal plug comprises tungsten.

14. The method according to claim 13, wherein the metal plug is formed using hydrogen ($H_2$) and tungsten fluoride ($WF_6$).

* * * * *